United States Patent [19]

Sattin

[11] Patent Number: 4,774,466
[45] Date of Patent: Sep. 27, 1988

[54] QUICK IMAGING SCHEME UTILIZING DIFFERENTLY PHASE ENCODED PRIMARY AND STIMULATED ECHOES

[75] Inventor: William Sattin, Cleveland, Ohio

[73] Assignee: Picker International, Inc., Highland Hts., Ohio

[21] Appl. No.: 897,118

[22] Filed: Aug. 15, 1986

[51] Int. Cl.$^4$ ............................................. G01R 33/20
[52] U.S. Cl. ................................................ 324/309
[58] Field of Search ............... 324/307, 309, 310, 311, 324/312, 314, 316

[56] References Cited

U.S. PATENT DOCUMENTS

| | | | |
|---|---|---|---|
| 4,291,271 | 9/1981 | Lauffer | 324/307 |
| 4,431,968 | 2/1984 | Edelstein et al. | 324/311 |
| 4,502,007 | 2/1985 | Mee et al. | 324/307 |
| 4,644,279 | 2/1987 | Hoshino et al. | 324/309 |

OTHER PUBLICATIONS

Frahm, J., et al., "Stimulated Echo Imaging", J. Magnetic Resonance 64, 81-93, 1985.
"Rare-Imaging: A Rapid Imaging Technique in NMR Tomography" by H. Friedburg & J. Henning, Zentrum Radiologie, Abt. Rontgendiagnostik; Medical Report 1985, pp. 13-14.
"Phase Encoded, Rapid Multiple-Echo (PERME) Nuclear Magnetic Resonance Imaging", M. S. Lawton, Master of Engineering Thesis, Lawrence Berkeley Laboratory, Univ. of California, Berkeley, CA, Aug. 1985, pp. 1-23.
"Rare-Imaging: A Fast Imaging Method for Clinical Routine", J. Hennig, University of Freiburg, SMRM Abstract, pp. 988-989, 1985.
"Phase Encoded, Rapid Multiple Echo (PERME) Imaging", by M. Lawton and T. F. Budinger, Univ. of California, Berkeley, SMRM Abstract; pp. 1009-1010, 1985.
"MR-Exploiting the Stimulated Echo in NMR Imaging, Part I", A Communication of News, Views and Reviews for Vista MR Users, vol. 1, No. 1, Picker Clinical Science Center, 1985.
"Exploiting the Stimulated Echo in Nuclear Magnetic Resonance Imaging, I. Method" by W. Sattin, T. H. Mareci, and Katherine N. Scott; Journal of Mag. Res., 64, pp. 177-182 (1985).
"Rapid Images and NMR Movies" by A. Haase et al., BioPhysical Chemistry, pp. 980-981, SMRM Abstracts, 1985.

Primary Examiner—Stewart J. Levy
Assistant Examiner—Kevin D. O'Shea
Attorney, Agent, or Firm—Fay, Sharpe, Beall, Fagan, Minnich & McKee

[57] ABSTRACT

A magnetic resonance excitation RF pulse (50) is applied to excite resonance in selected dipoles in an image region. A first phase encode gradient (56) phase encodes the resonating dipoles with one of a plurality of preselected phase angles. A magnetization rotation RF pulse (60), typically 90°, causes a primary echo (62) which is phase encoded with the preselected phase angle. A second magnetization rotation RF pulse (70) rotates the magnetization, typically 90°, to cause a stimulated echo (72). A second phase encode gradient pulse (78) is supplied subsequent to the second magnetization rotation pulse to alter the phase angle with which the stimulated echo is phase encoded. In this manner, data collected during the primary and stimulated echoes have different phase encoding such that more than one phase encoded view of data is generated following each excitation pulse.

22 Claims, 3 Drawing Sheets

QUICK IMAGING SCHEME UTILIZING DIFFERENTLY PHASE ENCODED PRIMARY AND STIMULATED ECHOES

BACKGROUND OF THE INVENTION

The present invention relates to the art of magnetic resonance spectroscopy. It finds particular application in conjunction with imaging body tissue in selected planar regions with primary-stimulated imaging sequences and will be described with particular reference thereto. However, it is to be appreciated that the present invention is also applicable to imaging and analysing of selected regions of animate and inanimate objects with field echo, spin echo, and other imaging sequences.

Heretofore, various imaging sequences have been utilized in medical diagnostic and other magnetic resonance imaging, e.g. spin echo sequences. A common imaging sequence included applying a 90° radio frequency excitation pulse to induce magnetic resonance in selected dipoles in an image region. A phase encoding gradient pulse was applied to encode the resonating dipoles with a selected phase angle. A magnetization rotation pulse, commonly a 180° inversion pulse, induced magnetization vectors of the resonating dipoles to converge toward a spin echo. Imaging data was then collected during the induced echo. To generate a 256 view image, the sequence was repeated 256 times, each time with a different phase angle encoding.

For some examinations, it was advantageous to generate images which were dominated by data attributable to the longer T1 relaxation times. In one technique for generating T1 rather than T2 weighted images, a 90° excitation pulse was followed by two 90° magnetization rotation pulses. A phase encode gradient was applied either between the excitation pulse and the second 90° pulse or between the third 90° pulse and an induced stimulated echo. The phase encode gradient caused the magnetic resonance data collected during the stimulated echo to have an appropriate phase angle encoding. To generate an image with 256 views, the sequence was repeated 256 times, each time with a different phase angle encoding gradient. Optionally, additional magnetization vector rotation pulses of an appropriate rotational angle were applied to cause additional stimulated echoes in the same sequence. By applying an additional phase encode gradient pulse after each magnetization vector rotation pulse, the phase encoding of the successive stimulated echoes could be altered. See for example, "Rapid Images and NMR Movies" A. Haase, et al., SMRM Abstracts, pages 980-981 (1985).

Various techniques were also developed for accelerating the data collection time for T2 weighted images. Typically information regarding more than one view was acquired during the sequence following each excitation. As one example, this was achieved by utilizing a Carr-Purcell sequence in which an appropriate phase encode gradient was applied adjacent each inversion pulse to alter the phase encoding of the following spin echo. For example, a 90° magnetic resonance excitation pulse was applied to excite magnetic resonance. A phase encoding gradient was applied followed by a 180° inversion pulse to induce a first spin echo. After collecting data during the first spin echo, another phase encoding pulse was applied to alter the phase encoding and a second 180° inversion pulse was applied to cause a second spin echo with the different phase encoding. The changing of the phase encoding and the application of an additional 180° inversion pulse was repeated a plurality of times following a single, initial excitation. See for example, "Phase-Encoded, Rapid Multiple-Echo (PERME) Imaging" M. Lawton, et al., SMRM Abstracts, pages 1009-1010 (1985).

One of the drawbacks to the multiple echo Carr-Purcell techniques was that the signal intensity varied greatly from echo to echo. Commonly, the T2 relaxation times in the body are short compared to the interval between inversion pulses in the multiple echo Carr-Purcell sequence. This variation caused the signal intensity to vary significantly from echo to echo, which greatly degraded image quality.

The present invention provides a new and improved magnetic resonance sequence which provides a unique and selectable weighting between T1 and T2 to overcome the above referenced problems and others.

SUMMARY OF THE INVENTION

In accordance with one aspect of the present invention, a magnetic resonance technique is provided. Two phase encoding gradients are applied during the sequence in such a manner that the magnetization components that cause primary and stimulated echoes are encoded with different phase encode angles. In this manner, data representing two differently phase encoded views can be collected following a single excitation. For example, only 128 repetitions of the sequence can generate 256 unique views.

In accordance with a more limited aspect of the invention, a method of magnetic resonance imaging is provided. First, a radio frequency pulse is applied to excite magnetic resonance of selected dipoles in a region of a subject. Second, a first phase encoding gradient is applied to phase encode at least first and second precessing magnetization components of the resonating dipoles. Third, a second radio frequency pulse is applied for concurrently causing the (1) first magnetization components to commence converging toward a primary echo and (2) causing the second components of the magnetization to be rotated to a direction which is unaffected by phase encoding gradients. Fourth, echo data is collected during the primary echo. Fifth, a third radio frequency pulse is applied to return at least some of the second magnetization components from the unaffected direction and to cause the returned second magnetization components to converge toward a stimulated echo. Sixth, data is collected during the stimulated echo. Seventh a second phase encode gradient is applied with the appropriate timing to alter the phase encoding of one of the first and second magnetization components. In this manner, the phase encoding of the primary and stimulated echoes is different. The above seven steps are repeated with different phase encodings until a preselected amount of echo data is collected. The collected echo data is reconstructed into an image representation.

In accordance with another aspect of the present invention, a magnetic resonance apparatus is provided which implements the above referenced technique.

One advantage of the present invention is that it enables two or more differently phase encoded views to be taken after each resonance excitation.

Another advantage of the present invention is that the relative T1 and T2 weighting of the views is selectable.

Another advantage of the present invention is that it provides improved image quality including good image contrast, freedom from perturbation of data about the zero phase encode view, freedom from T2 related interview artifacts, improved slice definition, and the like.

One more advantage of the present invention is that it enables the use of reduced amplitude phase encoding gradients.

Yet another advantage resides in reduced transmission power requirements attributable to the use of 90° rather than 180° RF pulses.

Still further advantages of the present invention will become apparent to those of ordinary skill in the art upon reading and understanding the following detailed description.

BRIEF DESCRIPTION OF THE DRAWINGS

The invention may take form in various steps and arrangements of steps or in various components and arrangements of components. The drawings are only for purposes of illustrating a preferred embodiment and are not to be construed as limiting the invention.

DETAILED DESCRIPTION OF THE PREFERRED EMBODIMENT

Figure 1:
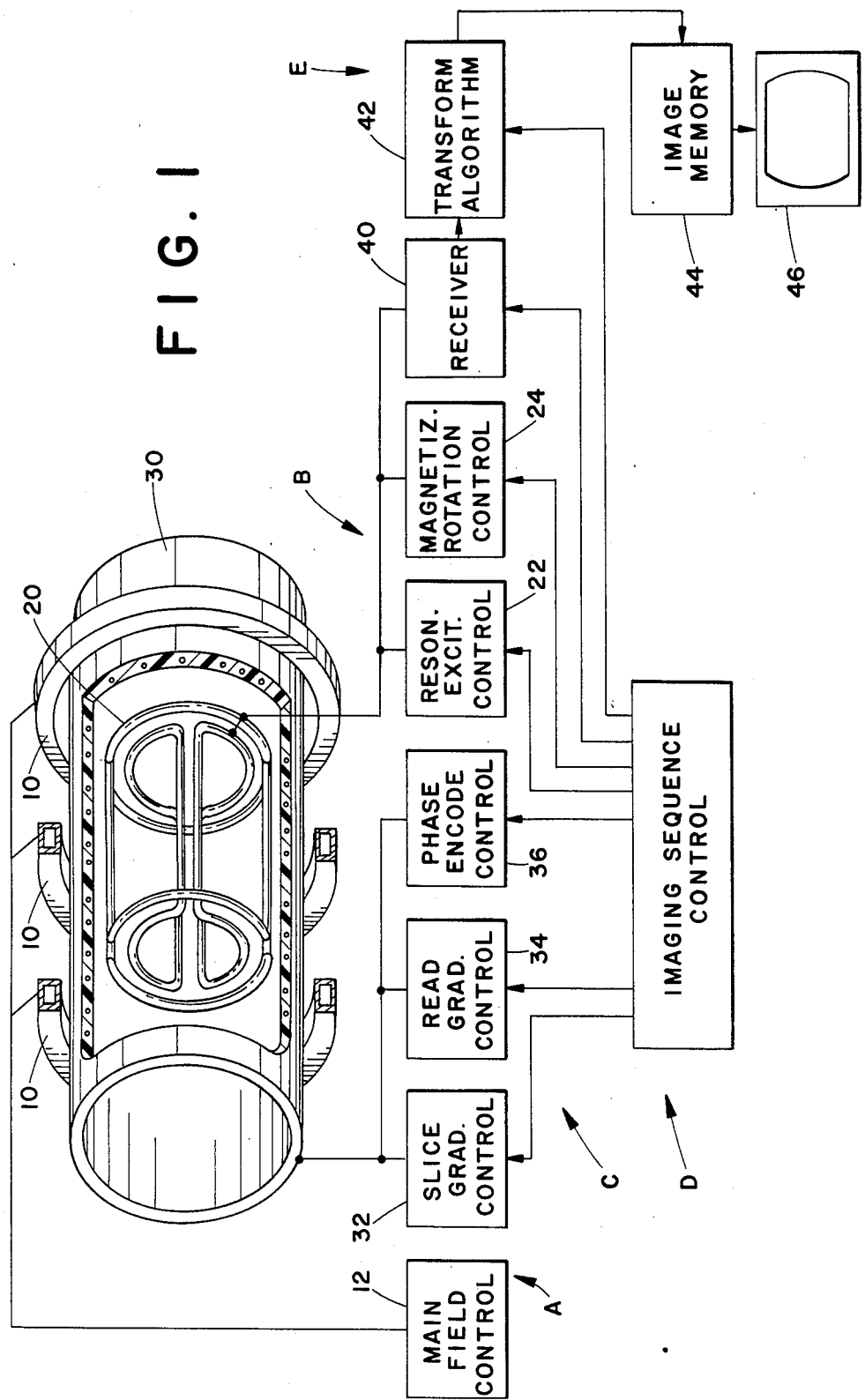
FIG. 1 is a diagrammatic illustration of a magnetic resonance imaging apparatus for implementing the present invention.

With reference to FIG. 1, a magnetic resonance imaging apparatus includes a main field means A for generating a substantially uniform magnetic field through an image region. A radio frequency means B selectively transmits radio frequency excitation pulses for generating magnetic resonance of the magnetization of selected dipoles within the image region. Further, the radio frequency means transmits radio frequency magnetization rotation pulses for selectively rotating selected components of the magnetization through 90° or other selected angles. A gradient field means C selectively applies gradient fields, preferably along three orthogonal axes across the image region. A pulse sequence control means D controls the radio frequency means and the gradient means to cause the generation of preselected pulse sequences in accordance with FIGURES 2-5. An image means E reconstructs an electronic image representation from received magnetic resonance signals for electronic storage, display on a video monitor, or the like.

The magnetic field means A includes a plurality of magnets 10 and a control circuit 12 therefor. The control circuit causes the magnets to generate a substantially uniform magnetic field axially therethrough, particularly in a centrally located image region.

The radio frequency means B includes a radio frequency coil 20, such as a quadrature coil which surrounds the image region. A resonance excitation control circuit 22 selectively applies radio frequency pulses to the RF coil 20 to excite magnetic resonance of selected dipoles in the image region. A typical resonance excitation pulse is a 90° pulse, i.e. a pulse which rotates magnetization vector components of the selected dipoles through an angle of 90°. A magnetization rotation control means 24 selectively causes components of the magnetization of the precessing dipoles to be further rotated through selected angles. When a single stimulated echo is generated, the magnetization is twice rotated through 90° after the initial 90° excitation RF pulse. If multiple stimulated echoes are to be generated, then the angles of rotation are adjusted, as is known in the art, to maintain uniformity from echo to echo of the RF pulse tip angle dependence of the magnetization component causing the stimulated echo. Optionally, pulses of other configurations for making other selected manipulations of the magnetization may be generated.

The gradient control means C includes a gradient coil 30 which includes a series of appropriate complex windings encased in plastic resin for causing gradients across the main magnetic field in the image region at selectable angles. In the preferred embodiment, the gradients are selectively caused along three orthogonal axes designated as the slice select, read, and phase encode axes or directions.

A first axis or slice selection gradient control means or circuit 32 selectively applies electrical power to appropriate windings of the gradient coil assembly to select one of a multiplicity of slices or planes in the image region to be phase mapped. Commonly, the slice is selected by applying a linear field gradient along the central or z-axis of the image region and applying a narrow band excitation pulse to excite spins over a limited range of resonance frequencies. A second axis or read gradient control 34 selectively applies a read gradient across the image region in the read gradient direction.

A third gradient or phase encode gradient control circuit or means 36 selectively applies phase encode gradients at selected amplitudes for encoding the resonance signal with selected phase angles. When 256 views are reconstructed into each image, gradients to encode a different one of 256 phase angls are successively applied. In this manner, the resonance data collected from the primary echo and the stimulated echo following each of 128 resonance excitations causes 256 views of data, each encoded with a different phase angle.

The received magnetic resonance data is received by radio frequency receiver 40 and transformed by a two dimensional fast Fourier transform or other algorithm 42, as is known in the art, into an image representation. The electronic image representation is stored in an image memory 44 and may be displayed on a video monitor 46, retained in memory, stored on tape, or subject to further processing as is conventional in the art.

Figure 2:
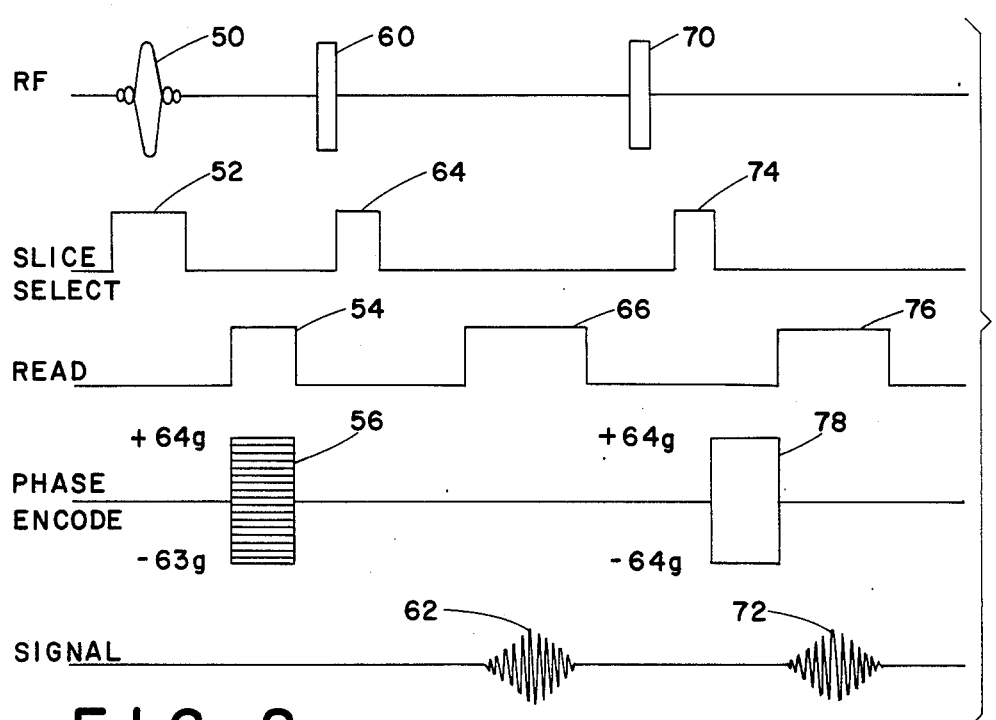
FIG. 2 illustrates a magnetic resonance sequence in accordance with the present invention.

With continuing reference to FIG. 1 and further reference to FIG. 2, the pulse sequence control means D coordinates the application of the radio frequency, slice select gradient, read gradient, and phase encode gradient pulses in such a manner that a primary echo encoded with a first phase encode angle and a stimulated echo encoded with a second phase encode angle is generated after each resonance excitation. The imaging sequence control means D causes the resonance excitation control circuit 22 to apply a first RF pulse 50 to excite resonance, specifically a 90° RF pulse. The slice select gradient control 32 is concurrently caused to apply a slice select gradient 52. Second, the imaging sequence control means causes the read gradient control 34 and the phase encode gradient control 36 to apply a read gradient pulse 54 and phase encode gradient pulse 56. In successive iterations of the sequence, the phase encode gradient is applied in incremental steps g, each incremental step representing a corresponding incremental shift in the encoded phase encode angle. The low angle phase encode gradients, i.e. those closest to a 0° phase encode angle, contribute low spatial frequency information, i.e. coarse resolution, and are primarily responsible for the image signal-to-noise, i.e. contrast. Views with the larger or higher phase encode angles at both positive and negative extremes, contribute the high spatial frequency information, i.e. the fine detail of the resultant image. The greater phase encoded views contribute little to the overall image signal-to-noise. In the embodiment of FIG. 2, the first phase encode gradient 56 ranges from −63g to +64g such that it can encode 128 phase encode angles, particularly the 128 smallest phase encode angles.

The image sequence control means D next causes the magnetization rotations means 24 to generate a second RF pulse 60, particularly a 90° pulse, which rotates magnetization vector components by 90°. The second RF pulse (i) causes first magnetization vector components to begin converging toward a primary echo 62 and (ii) causes additional or second components of the magnetization to be rotated 90° to a direction which is unaffected by phase encoding gradients. A slice select gradient pulse 64 and a read gradient pulse 66 are applied to control which resonating dipoles in the image region contribute to the sampled data. Primary echo magnetic resonance data is collected during the read gradient 66 to generate one view for reconstruction into an image representation by the image means E.

The image sequence control means D causes the magnetization rotation control 24 to apply a third RF pulse 70. In the illustrated embodiment in which only a single stimulated echo is generated, the third RF pulse 70 is another third 90° pulse when maximum stimulated echo signal intensity is desired. The third RF pulse rotates the second magnetization components 90° back along an axis in which they are affected by the phase encode gradients. The second magnetization rotation pulse also rotates a portion of the first magnetization components along the axis or direction which is unaffected by the phase encode gradients and in which they do not produce parasitic echoes or other signals which interfere with a stimulated echo 72 generated by the converging second magnetization components. The image sequence control means causes the slice select control means 32 to generate a slice select gradient pulse 74 and the read gradient control means 34 to generate a third read gradient 76 concurrently with the stimulated echo.

The first phase encode gradient 56 was applied before the second magnetization components were rotated along the unaffected direction. Accordingly, the second magnetization components which are rotated back by the third RF pulse 70 to converge as the stimulated echo, are already phase encoded with the same first phase encode angle. If the primary and stimulated echoes had the same phase encoding, the information conveyed thereby would be redundant in the sense that the data from both would represent the data encoded with the same phase angle. A second phase encode gradient 78 is applied by the phase control means 36 to alter the previous phase encoding. In the embodiment of FIG. 2, the second phase encode gradient adds a fixed offset phase encode angle. More specifically, the primary echo is encoded with the low phase encode angles and the stimulated echo with the high phase encode angles. The second phase encode gradient 78 adds an offset of +64g or −64g. The −64g offset is added to the magnetization components which were initially coded with a phase angle of 0 to −63g and the +64g offset gradient is applied to those of magnetization components which had initially been phase encoded with a phase angle of 1g through 64g. In this manner, the stimulated echo is encoded with phase encode angles of −64g through −127g and +65g through +128g. To generate a 256 view image, the sequence is only repeated 128 times. Each time the first phase encode gradient encodes a different phase encode angle, the second phase encode gradient adds +64g or −64g. In this manner, 128 repetitions of the sequence generates 256 views each with a unique phase encoding.

The duration between the third RF pulse 70 and the second RF pulse 60 is minimized to maximize the T2 weighting of the stimulated echo 72. This causes the relative T1 and T2 weighting of the primary and stimulated echoes to be generally the same. Increasing the duration between the second and third RF pulses increases a T1 weighting which is unique to the stimulated echo.

Figure 3:
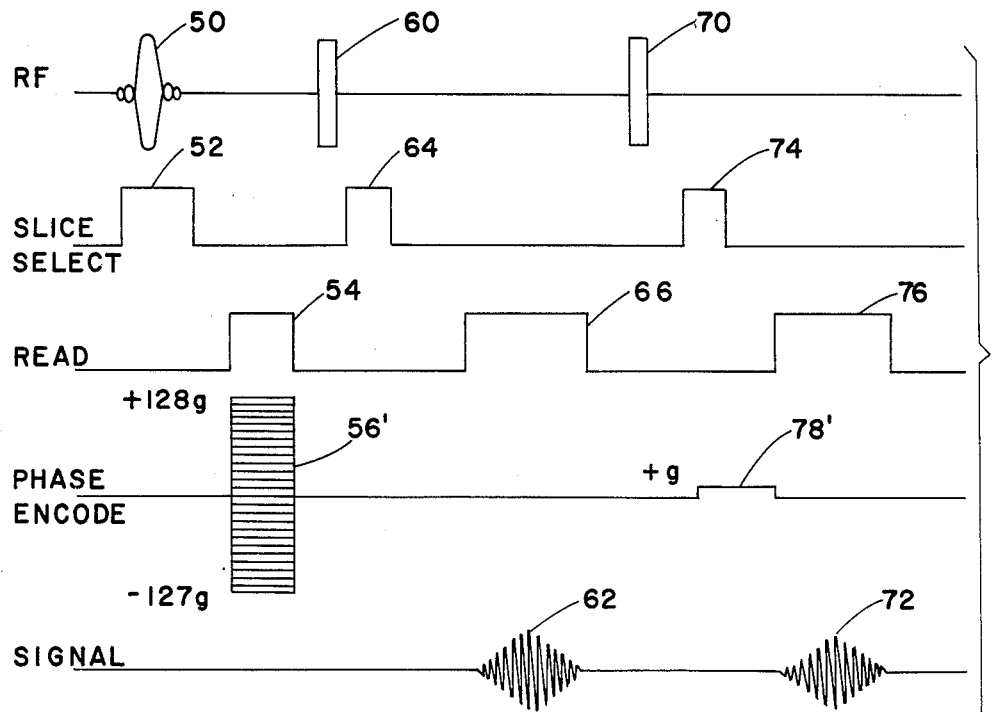
FIG. 3 illustrates an alternate embodiment of a magnetic resonance sequence of FIG. 2.

With reference to FIG. 3, it is to be appreciated that the phase angle encodings may be distributed in other ways between the primary and stimulated echoes. For example, the first phase encode gradient 56' may range in steps of 2g from −127g to +128g. The second phase encode gradient 78' may have an amplitude g. In this manner, the primary echoes generate signals corresponding to odd numbered phase encode angles and the stimulated echo generates data corresponding to the intervening even numbered phase encode angles.

Figure 4:
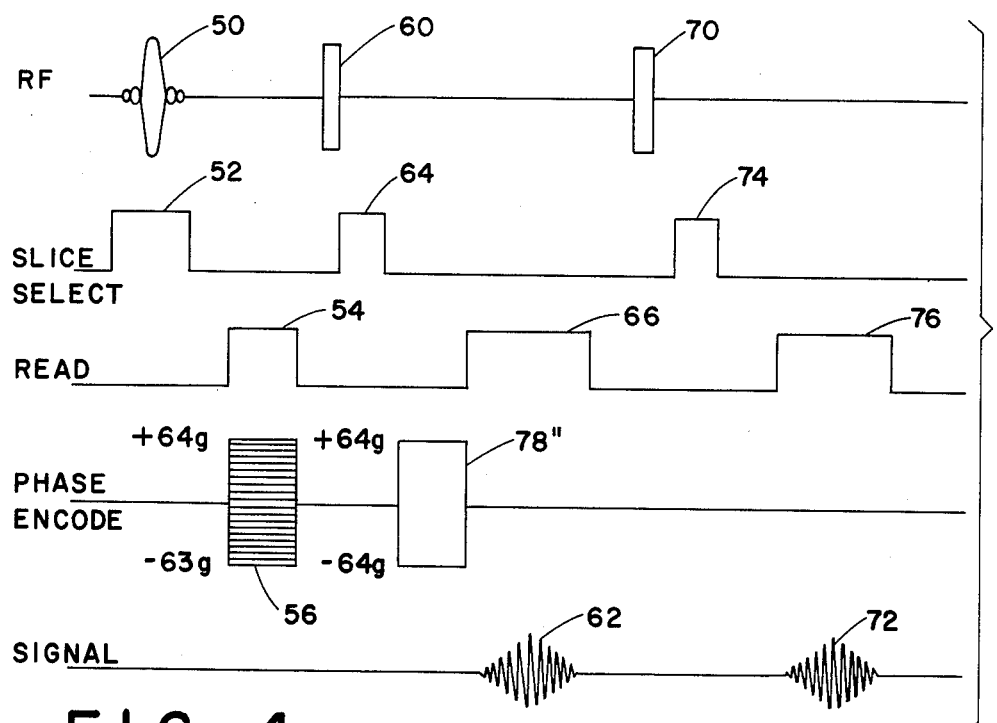
FIG. 4 illustrates another alternate embodiment of the magnetic resonance sequence; and, FIG. 5 illustrates yet another alternate embodiment of the magnetic resonance sequence, which alternate embodiment provides multiple echo and multiple slice data.

In the embodiment of FIG. 4, the second phase encode gradient 78" is applied such that the phase encode angle of the primary rather than the stimulated echo is altered. More specifically, the radio frequency, slice select, and read gradient pulses are applied with the same timing as described above in conjunction with FIG. 2. The first phase encode gradient 56 is again applied between the first RF pulse 50 and the second RF pulse 60 such that both the first and second magnetization components are phase encoded with the same phase encode angle. In the FIG. 4 embodiment, the first phase encode gradient pulse again assumes one of 128 magnitudes ranging from −63g to +64g in steps of g. After the first magnetization rotation pulse 60 is applied and the second magnetization components are rotated along a direction in which they are unaffected by the application of further phase encode gradients, a second phase encode gradient pulse 78" is applied. In the illustrated embodiment, the second phase encode gradient has a magnitude of +64g when the first phase encode gradient has a magnitude of g through +64g and −64g when the first phase encode gradient has a magnitude of 0 through −63g.

Applying the second phase encode gradient after the second RF pulse 60 and before the primary echo data is collected twice phase encodes the primary echo. The primary echo 62 is thus phase encoded with the sum of the phase encode angles attributable to the first and second phase encode gradient pulses. When the third RF pulse 70 rotates the second magnetization components out of the unaffected direction, they are still phase encoded with the phase encode angle of the first gradient 56. In this manner, the stimulated echo contributes the contrast and the coarse resolution to the resultant image and the primary echo contributes the fine detail resolution.

It is to be appreciated, that increasing the duration between the second and third RF pulses in the FIG. 3 embodiment will increase the T1 contribution in the stimulated echo hence to the contrast and coarse resolution of the resultant image. That is, the resultant image can be caused to have more the contrast and appearance of a stimulated echo T1 image by increasing the duration between the second and third RF pulses. In this manner, the relative T1/T2 weighting of the resultant image is selectable, in addition to the conventional means of controlling the T1/T2 weighting. With the primary echo contributing the high spatial frequency information and the primary echo having the greater signal intensity in this case compared to the T1 weighted stimulated echo, an edge enhancement phenomenon will occur.

Figure 5:
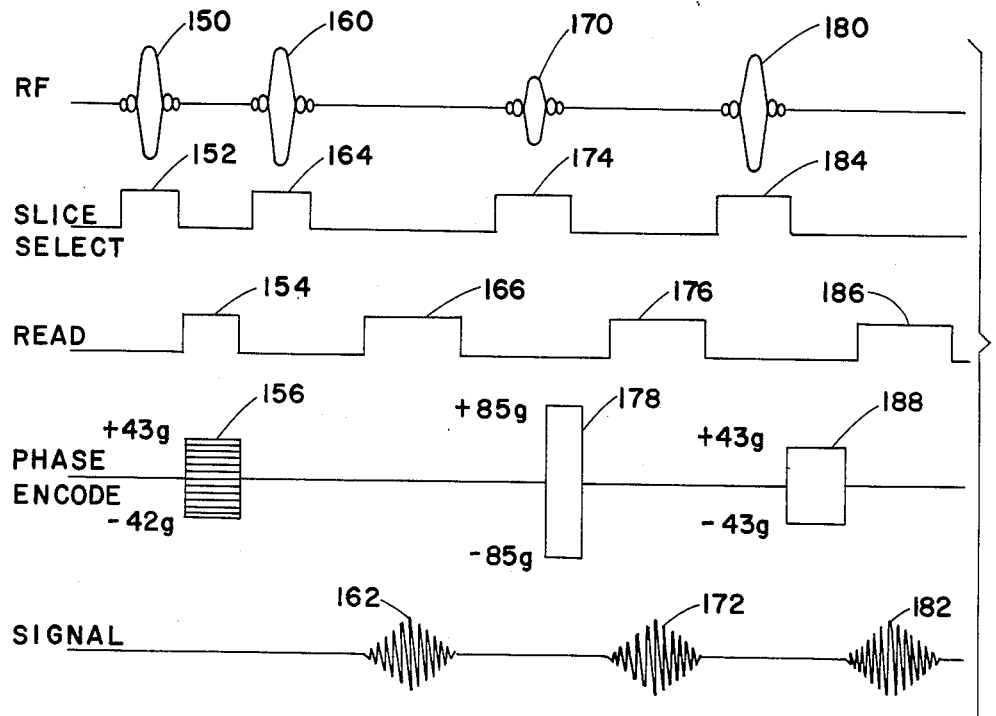

With reference to FIG. 5, the present invention is also applicable to multi-slice imaging and to imaging with multiple echoes. A first 90° RF pulse 150 and a first slice select pulse 152 are concurrently applied. Subsequently, a read gradient pulse 154 and a first phase encode gradient pulse 156 are applied. In the illustrated embodiment, the first phase encode gradient phase encodes the magnetization components with a selected one of a central one third of the phase encode angles. In the 256 view image example, the first phase encode gradient successively applies gradients of $-42g$ through $+43g$ in increments of g. A second RF pulse 160, preferably a 90° pulse, is applied to rotate the magnetization components and cause a primary echo 162. A second slice select pulse 164 is applied contemporaneously with the second RF pulse 160 and a second read gradient 166 is applied concurrently with the primary echo 162.

A third radio frequency pulse 170, preferably a 45° pulse is applied to cause a first stimulated echo 172. A third slice select gradient 174 is applied concurrently with the third RF pulse and a second read gradient 176 is applied concurrently with the first stimulated echo. A second phase encode gradient 178 with a fixed pulse or minus magnitude is applied to increase the phase encode angle of the magnetization components contributing to a first stimulated echo 172. In the illustrated embodiment, the second phase encode gradient pulse has a magnitude of $+85g$ when the first phase encode gradient pulse is the range of g to $+43g$ and a magnitude of $-85g$ when the first is in the range of 0 to $-42g$. In this manner, the data collected during the first stimulated echo 172 is encoded with the highest spatial frequency third of the phase encode angles.

Thereafter, a fourth RF pulse 180 is applied concurrently with a fourth slice select gradient 184 to cause a second stimulated echo 182. A fourth read gradient 186 is applied concurrently with the second stimulated echo. A third phase encode gradient 188 has a preselected fixed amplitude to alter the phase encode angle of the magnetization components which form the second stimulated echo to a second or intermediate frequency third of the phase encode angles. The third phase encode gradient has an amplitude of $\pm 43g$. It is to be appreciated that the primary echo and the second stimulated echo each have views phase encoded at $-42g$ and at $+43g$. One of each of these two redundant views may be deleted to reduce the number of views collected from 258 to 256. Moreover, these redundant views are helpful during calibration of view alignment.

Fifth and subsequent RF pulses with corresponding slice select, pulse encode, and read gradients may also be applied to generate fifth and subsequent stimulated echoes to expedite imaging still more. The first stimulated echo data has a better signal to noise ratio than the second stimulated echo data. The illustrated embodiment utilizes the first or most noise free stimulated echo data for the hgh phase encode angle or fine resolution views. Optionally, the second phase encode gradient may be $\pm 86g$ to eliminate the redundant views. To reduce the described 258 views to the 256 views which the imaging means E is designed to accomodate, the two highest phase encode angle views may be discarded.

It is to be appreciated that the phase of the primary echo and the stimulated echoes are also affected by the phase of the RF pulses. The phase of the RF pulses as well as the phase of the phase encode pulses determine whether the alteration to the phase encoding is added or subtracted. Reversing either one causes a substractive combination; reversing neither or both causes an additive combination.

Optionally, additional magnetization rotation pulses and slice select read and phase encode gradient pulses may be applied to cause third and subsequent stimulated echoes. Optionally, other relative echoes may be selected. The phase angles from the primary and plural stimulated echoes may also be interleaved.

Although described in terms of 256 view images, it is to be appreciated that 512 or larger view images, as well as 128 and smaller view images, are contemplated. The embodiments of FIGS. 2–4 can generate 512 views in the time required by the prior art to generate 256 views. Similarly, the FIG. 5 embodiment can generate 768 views in this same amount of time. Extending the FIG. 5 embodiment to a third stimulated echo would enable 1024 views to be collected in the same amount of time or, conversely, 256 views to be generated in a quarter of the prior art time. Analogously, quick pilot images of 128 views or less can be generated by the embodiments of FIGS. 2–4 in a quarter of the time required by the prior art to generate 256 views. The embodiment of FIG. 5 can generate a 192 view pilot image in the same reduced time.

The invention has been described with reference to the preferred embodiments. Obviously, modifications and alterations will occur to others upon reading and understanding the preceeding detailed description. It is intended that the invention be construed as including all such alterations and modifications in so far as they come within the scope of the appended claims or the equivalents thereof.

Having thus described the preferred embodiments, the invention is now claimed to be:

1. A method of magnetic resonance imaging comprising:
   (a) applying a first radio frequency pulse to excite magnetic resonance of selected dipoles in at least a region of a subject;
   (b) applying a first phase encode gradient for phase encoding at least first and second precessing magnetization components of the resonating dipoles;
   (c) applying a second radio frequency pulse for concurrently (1) causing the first magnetization components to commence converging toward a primary echo and (2) causing the second magnetization components to be rotated along a direction which is unaffected by phase encoding gradients;

(d) collecting primary echo magnetic resonance data during the primary echo;

(e) applying a third radio frequency pulse for rotating at least some of the second magnetization components from the unaffected direction and causing the rotated second magnetization components to converge toward a stimulated echo;

(f) applying a second phase encode gradient to alter the phase encoding of one of the first and second magnetization components such that the primary and stimulated echoes have different phase encoding;

(g) collecting stimulated echo magnetic resonance data during the stimulated echo;

(h) repeating steps (a) through (g) with different phase encodings; and, (i) reconstructing a common image representation from the collected primary and stimulated echo magnetic resonance data.

2. The method as set forth in claim 1 wherein the second phase encode gradient is applied subsequent to application of the third radio frequency pulse.

3. The method as set forth in claim 1 further including subsequent to step (g) the steps of:
applying a fourth radio frequency pulse for causing a second stimulated echo; and,
applying a third phase encode gradient subsequent to the fourth radio frequency pulse for altering the phase encoding of the second stimulated echo relative to the phase encoding of the primary echo and the first stimulated echo.

4. The method as set forth in claim 1 wherein:
the first phase encode gradient successively encodes phase angles g in a range of about −G to +G; and,
the second phase encode gradient encodes the phase of about a +G when the first phase encode gradient is in about the range of 0 to +G and applies a phase encode gradient of −G when the first phase encode gradient is in the range of about −G to 0.

5. The method as set forth in claim 1 wherein the first phase encode gradient successively encodes one of a plurality of phase encode angles displaced in even increments of 2g and wherein the second phase encode gradient alters the phase encoding by g such that the phase encode angles of the primary and stimulated echoes are interleaved.

6. A magnetic resonance method comprising:
exciting magnetic resonance in a subject;
following the excitation of magnetic resonance, generating a primary echo and at least a first stimulated echo;
phase encoding the primary and stimulated echo with different phase encode angles;
collecting primary and first stimulated echo data; and,
reconstructing a common image representation from the primary and first stimulated echo data.

7. The method as set forth in claim 6 wherein the phase encoding step further includes initially phase encoding magnetization components which generate the primary and stimulated echoes with the same phase encode angle and subsequently altering the phase encode angle of magnetization components which generate at least one of the primary and stimulated echoes.

8. The method as set forth in claim 6 further including inducing a second stimulated echo and phase encoding the second stimulated echo differently from the primary echo and the first stimulated echo.

9. The method as set forth in claim 6 wherein the primary echo and the stimulated echo are phase encoded with alternate phase encode angles.

10. The method as set forth in claim 6 wherein the resonance excitation step includes applying a first radio frequency pulse, the primary echo generating step includes applying a second radio frequency pulse, and the stimulated echo generating step includes a third radio frequency pulse.

11. The method as set forth in claim 10 wherein the phase encoding step includes:
applying a first phase encode gradient prior to the second radio frequency pulse to encode a first phase encode angle; and,
applying a second phase encode gradient between the third radio frequency pulse and the stimulated echo to alter the phase angle encoding, whereby the phase angle encoding is altered after the primary echo and before the stimulated echo.

12. The method as set forth in claim 11 wherein the first, second, and third radio frequency pulses are 90° pulses and further including applying a 45° radio frequency pulses between the second and third 90° radio frequency pulses to cause another stimulated echo and applying another phase encode gradient between the 45° radio frequenty pulse and said another stimulated echo.

13. The method as set forth in claim 10 wherein the phase encoding step includes:
applying a first phase encode gradient prior to the second radio frequency pulse to encode a first phase encode angle; and,
applying a second phase encode gradient between the second radio frequency pulse and the primary echo to alter the phase encode angle thereof.

14. The method as set forth in claim 10 wherein a duration between the second and third radio frequency pulses is minimized to maximize T2 weighting relative to T1 weighting of the stimulated echo.

15. The method as set forth in claim 10 wherein a duration between the second and third radio frequency pulses is increased to increase the effective T1 weighting of the stimulated echo.

16. The method as set forth in claim 15 wherein the stimulated echo is phase encoded with lower phase angles than the primary echo such that the image representation has contrast characteristics of a T1 weighted image.

17. A magnetic resonance method comprising:
exciting magnetic resonance of selected dipoles;
inducing a primary echo;
phase encoding at least one magnetization component of the resonating dipoles prior to the primary echo;
inducing a stimulated echo; and,
altering the phase encoding of the at least one magnetization component after the primary echo and before the stimulated echo to alter the phase encoding of the stimulated echo relative to the phase encoding of the primary echo such that the stimulated echo phase encoding to cumulative.

18. The method as set forth in claim 17 wherein the first phase encoding gradient phase encodes with a relatively small phase angle and wherein the second phase encoding gradient phase encodes the stimulated echo with a larger, peripheral phase encode angle.

19. A magnetic resonance method comprising:

applying a first radio frequency pulse to excite magnetic resonance;

applying a first phase encode gradient for phase encoding a first phase encode angle;

applying a second radio frequency pulse after application of the first phase encode gradient to induce a primary echo phase encoded in accordance with the first phase encode angle;

applying a third radio frequency pulse to induce a stimulated echo; and, applying a second phase encode gradient after the third radio frequency pulse and prior to the stimulated echo for phase encoding a second phase encode angle such that the stimulated echo is phase encoded in accordance with a sum of the first and second phase encode angles.

20. The method as set forth in claim 19 wherein the first phase encode angle is selected from one of a plurality of angles between a first minimum angle and a first maximum angle and wherein the second phase encode angle is substantially one of the first minimum and maximum angles.

21. The method as set forth in claim 19 wherein the first phase encode angle is selected from one of the plurality of phase encode angles that differ by a preselected angular increment and wherein the sound phase encode angle is about one half the preselected angular increment.

22. An apparatus for magnetic resonance imaging, the apparatus comprising:

a main magnetic field means for generating a substantially uniform magnetic field through an image region;

a radio frequency coil disposed adjacent the image region for transmitting radio frequency signals into the image region;

a resonance excitation control means for selectively causing the radio frequency coil to generate a first 90° radio frequency pulse;

a magnetization component rotation control means for selectively causing the radio frequency coil to generate radio frequency pulses for rotating magnetization components of resonating dipoles in the image region;

a phase encoding gradient control means for selectively causing a gradient coil to apply phase encoding gradients in the image region for phase encoding the resonating dipoles with one of a plurality of preselected phase angles;

an imaging sequence control means for sequentially causing:

the resonance excitation control means to excite magnetic resonance, causing the phase encoding gradient control means to cause a first phase encode gradient pulse, causing the magnetization rotation control means to induce a primary echo and subsequent to the primary echo causing the magnetization rotation control means to induce a stimulated echo, and causing the phase encode gradient control means to apply a second phase encode gradient to alter the phase encoding of one of the primary and stimulated echoes relative to the other;

a radio frequency receiver means for receiving magnetic resonance signals from the image region during the primary and stimulated echoes; and an imaging means for reconstructing an image representation from the received data.

* * * * *